Oct. 11, 1960 T. P. BOTHWELL 2,956,175

TRANSISTOR GATE CIRCUIT

Filed July 30, 1956

INVENTOR.
Theodore P. Bothwell
BY Morris A. Rabkin
ATTORNEY.

United States Patent Office 2,956,175
Patented Oct. 11, 1960

2,956,175

TRANSISTOR GATE CIRCUIT

Theodore Paul Bothwell, Collingswood, N.J., assignor to Radio Corporation of America, a corporation of Delaware Filed July 30, 1956, Ser. No. 601,018

4 Claims. (Cl. 307—88.5)

This invention relates to transistor gate circuits.

Gate circuits have found wide application, for example, in the fields of electronic computers, multiplexing, and automation. These gate circuits include coincidence gates, usually referred to as "and" gates, which supply an output signal in response to the simultaneous application of a plurality of input signals.

Gate circuits employing vacuum tubes have substantial power losses. Further, it is desirable not only to reduce such power losses but to reduce the signal level at which the gate circuit responds. Gate circuits using diodes have also been employed to perform logical gating functions. Diode gate circuits, however, undesirably attenuate input signals. Prior gate circuits using semiconductor devices, such as transistors, have been devised in an effort to overcome the disadvantages of vacuum tube gate circuits and of diode gate circuits. These transistor gate circuits, however, have a relatively slow speed of response.

It is an object of the present invention to provide an improved transistor gate circuit.

Another object of the present invention is to provide an improved transistor gate circuit which operates at a high rate of speed with relatively low input signal levels.

A further object of the invention is to provide a novel transistor gate circuit responsive to a lower input signal level than prior transistor gate circuits.

A further object of this invention is to provide an improved transistor gate circuit that has a low impedance input and yet provides isolation between the inputs.

It is another object of this invention to provide an improved transistor gate circuit, which circuit operates at a high rate of speed and provides an amplified output.

These and other objects of the present invention are achieved by providing a gate circuit comprising a gating transistor and an auxiliary transistor. The gating transistor, coupled as a common base amplifier, is gated by the auxiliary transistor directly coupled in series with the base lead of the common base amplifier.

In one embodiment described herein, the auxiliary transistor is coupled as a common emitter stage. In other embodiments described herein, the auxiliary transistor is connected as a common base stage or as a common collector stage. In each case, gating signals are applied to the emitter of a gating transistor and to the base or emitter, as the case may be, of the auxiliary transistor. Conduction (preferably saturation) in the auxiliary transistor removes a reverse bias on the emitter-base diode of the gating transistor to permit amplification of a signal applied to the emitter of the gating transistor. Non-conduction and conduction, respectively, in the auxiliary transistor are governed by a gating signal applied to the base or emitter, as the case may be. Since the auxiliary transistor couples the base of the gating transistor to a point of reference potential, the coupling between the gating transistor base electrode and the auxiliary transistor is preferably one of negligible ohmic impedance. In this manner, when the auxiliary transistor approaches saturation the gating transistor is effectively coupled directly to the point of reference potential and high speed gating results. Further, good isolation between the inputs of the two transistors is obtained since the auxiliary transistor may have a low input impedance.

The novel features of this invention as well as the invention itself, both as to its organization and method of operation, will best be understood from the following description, when read in connection with the accompanying drawings, in which like reference numerals refer to like parts, in which.

Figure 1:
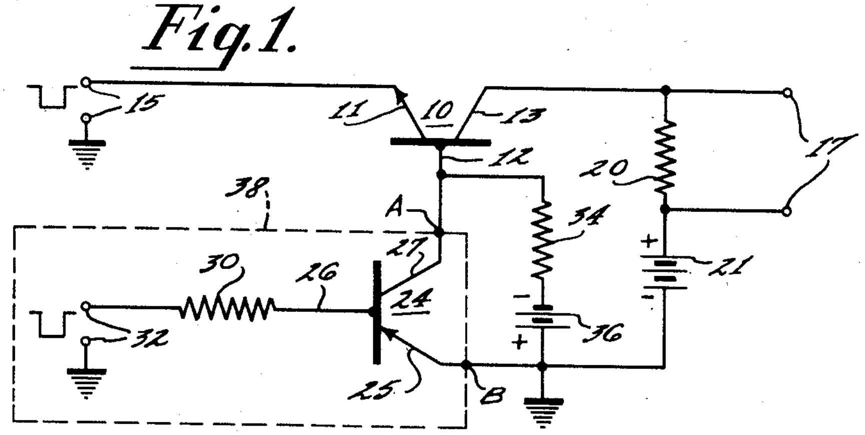
Figure 1 is a circuit diagram of one embodiment of the invention.

In Figure 1, a first junction transistor 10 of the N–P–N type has an emitter electrode 11 connected to one of a first pair of input terminals 15. The other terminal of the pair is connected to a point of reference potential, indicated as ground, for the circuit. The transistor 10 may be termed a switching or gating transistor, and has also a base electrode 12 and a collector electrode 13. The collector 13 is connected to one of a pair of output terminals 17. The other of the pair of output terminals 17 is connected to the positive terminal of a direct current source which may, for example, be a battery 21. A load resistor 20 is connected across the pair of output terminals 17.

A second junction transistor 24 of opposite conductivity type to the transistor 10 has a base electrode 26 which is connected through an isolating impedance element, a resistor 30, to one of a second pair of input terminals 32. The other of the second pair of input terminals 32 is connected to ground. The transistor 24 is termed an auxiliary transistor, and has also an emitter electrode 25, which is connected to ground, and a collector electrode 27, which is coupled through a load impedance element 34 to the negative terminal of a direct current source 36 which may, for example, be a battery. The collector 27 of the second transistor 24 and the base 12 of the first transistor 10 are coupled directly together by a direct current coupling having a negligible ohmic impedance. The second transistor 24 and its input circuit are indicated as a circuit 38. Other circuits 38 will be described later in conjunction with Figures 2 and 3.

Similarly, the bias voltage level at the input terminals 15 is maintained at approximately ground level or slightly negative with respect to ground. Quiescently, the bias voltage at the input terminals 32 which is applied to the base 26 of the second transistor 24 is that of ground or slightly positive with respect to ground. In this manner, the emitter-base diode (junction) 25—26 of the second transistor 24 is zero or slightly reverse biased, with the result that a very high impedance results between the collector 27 and emitter 25. It is noted that the second transistor 24 is connected to operate as a common emitter amplifier. As stated above, initially the second transistor 24 is biased such that the impedance between the collector 27 and the emitter 25 is very high. With a high impedance between the collector 27 and the emitter 25 of the second transistor 24, little current flows through the series combination of the direct current source 36 and the resistor 34. Accordingly, little voltage drop results across the resistor 34 and essentially all of the negative bias of the direct current source 36 is applied to the base 12 of the first transistor 10. This bias, applied to the base 12 of the first transistor 10, is large enough so that, even in the presence of a negative gating signal applied at the first pair of input terminals 15 the base-emitter diode 12, 11 of the gating transistor 10 remains reverse biased and the transistor 10 non-conducting. Consequently, no output signals result at the pair of output terminals 17 solely in response to input signals applied to the first input terminals 15.

If, however, simultaneously with the negative gating signal at the first pair of input terminals 15, a similar negative gating signal is applied to the input terminals 32 of the second transistor 24, the emitter-base diode 25, 26 of this latter transistor 24 becomes forward biased and the second transistor 24 tends to a relatively conducting condition. With the proper selection of the common load resistor 34, the second transistor 24 may, upon the application of the negative gating signal at the input terminals 32, be made to operate in saturation.

Under conditions of saturation, a larger number of charge carriers are present in the body of the second transistor 24 than can be withdrawn from its collector 27. The impedance of the second transistor 24 between collector 27 and emitter 25 approaches zero. Current flow through the common load resistor 34 is relatively heavier, resulting in a greater voltage drop across this resistor such that the potential at the base 12 of the gating transistor 10 rises toward ground potential. The base-emitter diode 12, 11 of the first transistor 10 becomes essentially zero biased or slightly forward biased. Because of the low collector emitter impedance of the second transistor 24, the first transistor 10 is now in a condition to operate as a common base amplifier, that is, its base 12 is effectively coupled (through the second transistor 24) to ground. Application of a negative signal to the first input terminals 15, causes the first transistor 10 to conduct, thereby producing a negative output signal across the output terminals 17.

By way of summary, the gate of Figure 1 provides an output upon the simultaneous occurrence of negative pulses upon the input terminals 15 and 32. Because of the use of two transistors, these two input gating signals are virtually isolated from one another.

Since the second (common emitter) transistor 24 is connected between the base 12 of the first (common base) transistor 10 and ground, the state of the second transistor 24 controls the base-emitter bias of the first transistor 10. Thus, if the second transistor 24 is saturated, the base-emitter bias of the first transistor 10 approaches zero and any negative signal applied to the emitter of the first transistor 10 will cause current to flow in its collector 13. Conversely, if the second transistor 24 is cut-off the full potential of the collector current source 36 of the second transistor 24 is applied between the base 12 and emitter 11 of the first transistor 10, thereby reverse biasing the first transistor base-emitter diode 12—11 for input signals having a magnitude smaller than this bias. Since both current and voltage gains are achieved in the second transistor (coupled as a common emitter) a great advantage in power required to operate the gating circuit of Figure 1 is achieved.

Low level input signals may be employed. Due to the voltage amplification by the first transistor (coupled as a common base stage) the output signals across the output terminals 17 have relatively short rise and fall times.

Figure 2:
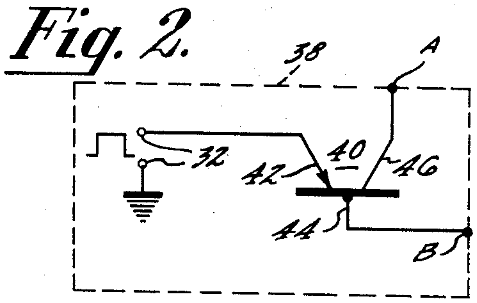
Figures 2 and 3 are modifications of the auxiliary transistor circuit shown within the dotted lines of Figure 1; and, Figure 4 is a circuit diagram illustrating a particular application of the gate circuit of Figure 1.

Figure 2 is an alternative for the circuitry enclosed within the circuit 38 of Figure 1. The circuit 38 of Figure 2 includes an auxiliary transistor 40 of the P–N–P junction type having an emitter electrode 42, a base electrode 44, and a collector electrode 46. Terminals A and B of the circuit 38 of Figure 2 are to be connected at terminals A and B of Figure 1. The auxiliary transistor collector 46 of Figure 2 is then coupled directly to the base 12 of the first transistor 10 (Fig. 1) and the auxiliary transistor base 44 is coupled directly to ground. In Figure 2, the emitter 42 is coupled to the ungrounded one of the pair of input terminals 32. The gating pulses at the input terminals 32 are quiescently at ground level as in Figure 1, but positive gating pulses are required.

Upon the application of a positive input gating signal to the input terminals 32, with the circuit 38 of Figure 2 in use, the emitter-base diode 42, 44 of the auxiliary transistor 40 becomes forward biased. The second transistor 40 thus goes from a state of relative non-conduction into a state of conduction thereby drawing current through the common resistor 34 (Fig. 1). The current flow through the common resistor 34 (Fig. 1) in turn causes the base-emitter diode 12, 11 of the first transistor 10 (Fig. 1) to become forward biased. In the manner described in conjunction with Figure 1, the gating action is now effectuated. Again, with the proper selection of the load resistor 34, the second transistor 40 (Fig. 2) tends to go into a state of saturation thereby having a very low impedance. Since the connection between the base 12 of the first transistor 10 (Fig. 1) and the auxiliary transistor collector 46 is of negligible ohmic impedance, the first transistor 10, as in the embodiment of Figure 1, operates effectively as a common base amplifier. The advantages when using the circuit 38 of Figure 2 instead of that of Figure 1 are similar to those of the arrangement of Figure 1. A positive going gating pulse is used for one input. Also, with somewhat larger inputs to the auxiliary transistor 40, a faster operation may be obtained.

Figure 3:
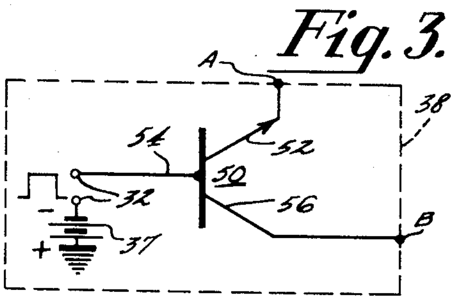

In Figure 3, another circuit 38 is illustrated which may be used in conjunction with the circuit of Figure 1 to provide still another embodiment of the invention. An N–P–N junction type transistor 50 is illustrated as the auxiliary transistor having an emitter electrode 52, a base electrode 54, and a collector electrode 56. The base 54 is coupled to one of the pair of input terminals 32. Terminals A and B indicate the connections to be made when replacing the circuit 38 of Figure 1 with the circuit 38 of Figure 3. The other one of the pair of input terminals 32 is coupled to the negative terminal of a battery 37. The positive terminal of the battery 37 is connected to ground. The battery 37 as a source of potential has a value equal to or slightly less than the current source 36 such that the emitter-base diode 52—54 of the auxiliary transistor 50 is reverse biased and the transistor 50 maintained non-conducting. A positive signal at terminals 32 is required to start conduction in the auxiliary transistor 50.

Upon the application of a positive pulse across the second input terminals 32, when using the circuit of Figure 3 in the arrangement of Figure 1, the base-emitter diode 54—52 of the auxiliary transistor 50 becomes forward biased. The auxiliary transistor 50 effectively functions as an emitter follower with the common resistor 34 (Fig. 1) as the emitter load. The potential at the auxiliary transistor emitter 52 increases an amount approximately equal to the increase at the base 54. If the input signal at the second input terminals 32 is made sufficiently large in magnitude such that an excess of charge carriers accumulate in the base 54, the auxiliary transistor 50 becomes saturated, as described in Figure 1. The input signal at the second input terminals 32, when transmitted to the first transistor base electrode 12, overcomes the reverse bias at the base-emitter diode 12, 11 of the first transistor 10 (Fig. 1). It will be recalled that this reverse bias results (as in the embodiment of Fig. 1) from the battery 36, whose full negative voltage is applied to the base 12 of the first transistor 10 when the auxiliary transistor is non-conducting.

The simultaneous occurrence of an appropriate negative gating signal at the first input terminals 15 places the first transistor 10 in a state of conduction. Collector current flows thereby producing a negative output signal across the output load resistor 20. When the auxiliary transistor 50 approaches a state of saturation, the impedance between the collector 56 and emitter 52 approaches zero, and the first transistor 10 operates essentially as a grounded base amplifier. The operation is thus similar to that described in connection with Figure 1, with similar advantages. Somewhat larger input signals are required for the embodiment of Figure 3. Note that one of the input signals is of positive polarity.

Figure 4:
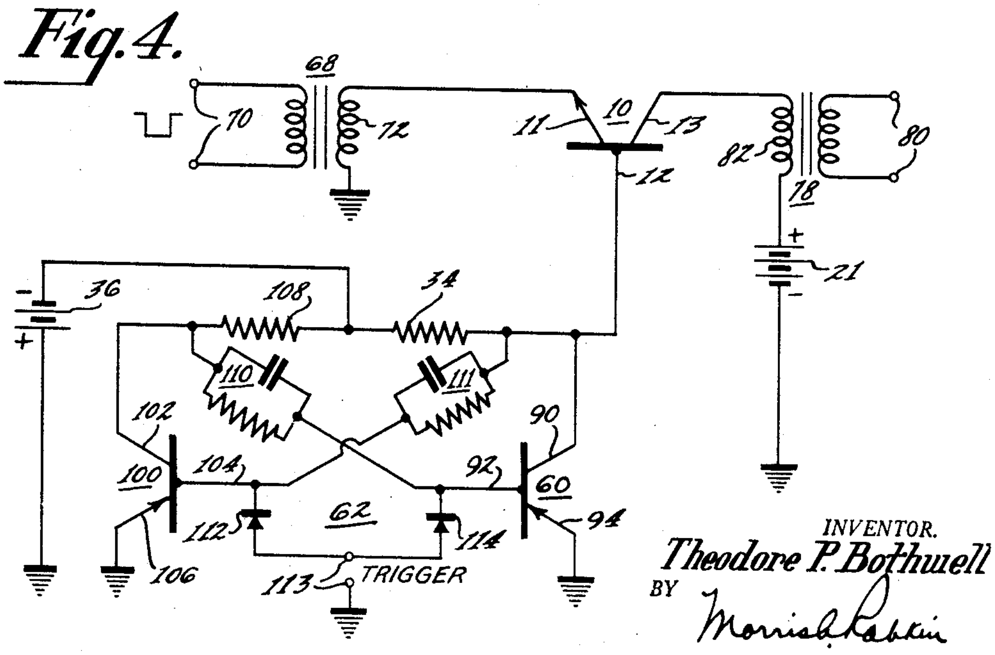

Figure 4 is a schematic circuit diagram of another embodiment of the invention in which an auxiliary transistor 60 (corresponding to transistor 24 in Fig. 1) is part of the flip-flop circuit 62. The condition of the flip-flop then controls the passage or non-passage of a signal through the switching transistor 10. The switching transistor 10 is of the same type and includes the same elements as described in Figure 1. In Figure 4, however, the emitter 11 of the gating transistor 10 is coupled through an input transformer 68 to a pair of input terminals 70. The emitter 11 is coupled serially through the secondary 72 of the input transformer 68 to ground. The collector 13 of the first transistor 10 is coupled through a transformer 78 to a pair of output terminals 80 and serially through a primary winding 82 of the output transformer 78 to the positive terminal of the direct current source of potential 21, the other terminal of which source of potential 21 is coupled to ground. In turn, the first transistor 10 has a base 12 which is coupled directly to the collector electrode 90 of the second transistor 60. This coupling desirably has a zero impedance. The second transistor 60 also has a base electrode 92 and an emitter electrode 94. The common (collector load) resistor 34 (corresponding to Figure 1) is coupled between the negative terminal of the direct current source 36 and the second transistor collector 90. The positive terminal of the direct current source 36 is connected to ground.

The remainder of the circuit of Figure 4, including the second transistor 60, forms a typical flip-flop circuit. Flip-flop circuits, as is well known, have two stable states of conduction. The flip-flop circuit 62 includes the second transistor 60, which forms part of the gating network, and a third transistor 100. Both transistors 60 and 100 are of the same type of conductivity. The third transistor 100 has a collector electrode 102, a base electrode 104, and an emitter electrode 106. The collector 102 is coupled through a collector load resistor 108 to the negative terminal of the source 36. Cross coupling networks 110 and 111 are provided for coupling the respective collectors 102 and 90 to the respective bases 92 and 104. The emitters 106 and 94 of each of the flip-flop transistors 100 and 60 are coupled to ground. The flip-flop 62 includes a pair of trigger input terminals 113, one of which is coupled to ground. The other of the trigger input terminals 113 is coupled through a pair of diodes 112 and 114, respectively, to the corresponding bases 104 and 92 of the flip-flop transistors.

The trigger input terminals are maintained quiescently at approximately ground potential. With the application of positive trigger signals at the input terminals 113, the conducting flip-flop transistor becomes non-conducting and the state of the flip-flop 62 reverses due to the regenerative action which takes place in the cross coupling networks 110 and 111. Briefly, if the second transistor 60 is in a state of conduction, the potential on the collector 90 of the second transistor 60 is high (i.e., more positive) relative to that on the collector 102 of the third transistor 100. The third transistor 100 is non-conducting. Application of a positive trigger signal at the terminals 113 places a positive voltage at the base 92 of the second transistor 60. The emitter-base diode 94, 92 becomes reverse biased and the collector current flow from this transistor decreases. Decreased collector current results in a drop in voltage on the collector 90 of this transistor due to the decreased voltage drop across the common resistor 34. This drop in collector voltage passes as a negative voltage increment through the cross coupling network 111 to the base 104 of the third transistor 100. The emitter-base diode 106, 104 of the third transistor 100 is thereby forward biased and collector current begins to flow from (conventional current) this transistor. Collector current from the third transistor 100 produces an increase in collector voltage which passes as a positive voltage increment through the cross coupling network 110 to the base 102 of the second transistor 60 thereby maintaining the emitter-base diode 92, 94 reverse biased. The trigger signal is now removed. This action becomes cumulative and the state of conduction of the flip-flop 62 is substantially instantaneously reversed. The third transistor 100 is now conducting and conversely the second transistor 60 is non-conducting.

With the flip-flop 62 in this state, the impedance between the emitter and collector of the second transistor 60 is high. Correspondingly, the voltage drop between these electrodes is essentially that of the current source 36. This voltage drop is thereby applied to the base 12 of the first transistor 10, reverse biasing the base-emitter diode 12, 11. If a negative pulse is applied to the input terminal 70 during this period in which the flip-flop 62 is in this state, no output results at the output terminals 80, unless such input pulse is greater in negative magnitude than that of the current source 36.

If, on the other hand, a trigger pulse is again applied at the flip-flop input terminals 113, the state of the flip-flop is reversed from the above condition, and the second transistor 60 is conducting. Preferably, the second transistor 60 is in a state of saturation as described in Figure 1. Upon the application of a negative gating pulse at the first transistor input terminals 70 the operation is the same as described in Figure 1. The emitter-base diode 11, 12, being forward biased by the action of the conducting second transistor 60 on the common resistor 34, allows the first transistor 10 to conduct as was described more fully with regard to Figure 1. If the flip-flop second transistor 60 is saturated, the first transistor 10 operates as a common base amplifier. In general, the advantages of Figure 4 are the same as those of Figure 1 since the gating portions of the circuits are substantially identical.

It is noted that by reversing the conductivity of the transistors employed along with a corresponding reversal of the polarities of the input signals and current sources, similar gating circuits to those of the disclosed embodiments are readily obtained.

There has thus been described a simple, reliable, high speed transistor gate that operates with low level input signals to provide amplified gated output signals.

What is claimed is:

1. A gate circuit comprising, in combination: a first semiconductor device of one conductivity type and including a first emitter electrode, a first base electrode, and a first collector electrode; a second semiconductor device of opposite conductivity type and including a second emitter electrode, a second base electrode, and a second collector electrode; negligible impedance means coupling said second base electrode to said first collector electrode; means for biasing said second device in the normally non-conducting condition, said biasing means including the collector-emitter path of said first device and an energizing means connected in parallel with said collector-emitter path; means for applying signals from a first source to one of said first base electrode and said first emitter electrode to enhance conduction in said first device whereby the impedance of said collector-emitter path and the bias on said second device are decreased; and means for applying signals from a second source to said second emitter electrode, said latter signals being of insufficient amplitude to overcome the normal bias on said second device.

2. A gate circuit comprising, in combination: a first transistor having a first base electrode, a first emitter electrode, and a first collector electrode; a second transistor including a second base electrode, a second emitter electrode and a second collector electrode, said second base electrode being connected through a negligible impedance to said first collector electrode; means for applying first signal pulses to said second emitter electrode, said first pulses having a polarity tending to bias the base-emitter path of said second transistor in the forward direction; output circuit means and a biasing source serially connected between said second collector electrode and said first emitter electrode; means for normally biasing the base-emitter path of said second transistor in the reverse direction such that said first signal pulses are not passed by said second transistor, said bias means including the collector-emitter path of said first transistor and an energizing means connected between said first collector and emitter-electrodes; and means for applying to one of said first base electrode and said first emitter-electrode other signal pulses of such polarity and magnitude as to appreciably reduce the impedance of said collector-emitter path of said first transistor and the reverse bias on said second transistor, whereby said first signals are passed by said second transistor during the application of said other signals.

3. A gate circuit comprising a first transistor having a base electrode, an emitter electrode, and a collector electrode; a signal source and a load connected to different ones of said emitter electrode and said collector electrode; a normally non-conducting second transistor having a base electrode, an emitter electrode, and a collector electrode; biasing means including the parallel combination of a voltage source and the collector-emitter path of said second transistor connected to the base electrode of said first transistor for normally biasing said first transistor in the non-conducting condition, whereby signals from said source are normally inhibited, one of said collector electrode and said emitter electrode of said second transistor being connected by negligible impedance means to the base electrode of said first transistor; and means for selectively reducing the bias on said first transistor to enable signal translation between said source and said load, said bias reducing means comprising means for applying to one of said base electrode and the other of said collector electrode and said emitter electrode of said second transistor a signal having a polarity and magnitude to drive said second transistor into conduction.

4. A gate circuit comprising a first transistor having a base electrode, an emitter electrode, and a collector electrode; a first signal source and an output load respectively connected to said emitter electrode and said collector electrode; biasing means including a voltage source connected to said base electrode for normally biasing said first transistor in the non-conducting condition whereby signals from said source are normally inhibited; and means for selectively reducing the bias on said first transistor to enable signal translation between said first source and said load, said reducing means including a normally non-conducting second transistor having a base electrode, an emitter electrode and a collector electrode; means connecting the collector-emitter path of said second transistor in parallel with said biasing means, one of said collector electrode and said emitter electrode being connected to said first transistor base electrode through a negligible impedance means; and means for applying to one of said base electrode and the other of said collector electrode and said emitter electrode of said second transistor a signal having a polarity and magnitude to drive said second transistor into conduction.

References Cited in the file of this patent

UNITED STATES PATENTS

| | | |
|---|---|---|
| 2,774,888 | Trousdale | Dec. 18, 1956 |
| 2,776,420 | Woll | Jan. 1, 1957 |
| 2,829,281 | Van Overbeek | Apr. 1, 1958 |

FOREIGN PATENTS

| | | |
|---|---|---|
| 1,081,207 | France | Dec. 16, 1954 |
| 1,110,585 | France | Oct. 12, 1955 |